DEFLECTION TYPE DIRECT CURRENT AMPLIFIER

Filed Feb. 5, 1963

INVENTOR.
HAROLD D. JOHNSON

BY
Eyre, Mann & Lucas
ATTORNEYS

United States Patent Office 3,196,363
Patented July 20, 1965

3,196,363
DEFLECTION TYPE DIRECT CURRENT AMPLIFIER

Harold D. Johnson, Parsippany, N.J., assignor to Tung-Sol Electric Inc., a corporation of Delaware
Filed Feb. 5, 1963, Ser. No. 256,411
4 Claims. (Cl. 330—46)

This invention relates to a direct current amplifier arrangement employing a deflection type discharge device and an auxiliary triode. The invention has particular reference to an amplifier which has very high input impedance and cannot be overloaded.

There are many application, particularly in television circuits, where a direct current amplifier is needed with the ability of amplify signals of very high frequency. Several circuits have been designed and used for such applications but there are critical, hard to adjust, and are subject to drifting. The present invention avoids all of these difficulties and, in addition, has an input impedance which is almost infinite.

One of the objects of this invention is to provide an improved direct current amplifier which avoids one or more of the disadvantages and limitations of prior art arrangements.

Another object of the invention is to provide direct current amplification for a high impedance signal resulting in a reversible current in a low impedance load.

Another object of the invention is to increase the output current through the load resistor.

Another object of the invention is to provide a large ratio of amplification between an input voltage and an output current while retaining a wide-range frequency characteristic.

Another object of the invention is to provide an amplifier arrangement which is linear over a wide range of positive and negative input voltages.

The invention comprises a direct current amplifier having a pair of input terminals for connection to an external signal source. The input terminals are connected to a deflection discharge device which includes an evacuated envelope, a cathode with means for emitting a stream of electrons, two coplanar anodes, and two deflection electrodes connected to the input terminals and adapted to shift the electron stream to either anode. A direct current power supply is connected between the cathode and the anodes through a load circuit which includes a pair of output terminals for connection to a load, a first resistor connected between a load terminal and one of said deflection anodes, and a second resistor connected between the other load terminal and the power supply. A triode electron discharge device is coupled to the deflection device and includes an anode connected to the power supply, a cathode connected to the junction between the load and the first resistor, and a control electrode connected to the junction of the first resistor and one of the deflection anodes.

For a better understanding of the present invention, together with other and further objects thereof, reference is made to the following description taken in connection with the accompanying drawings.

Figure 1:
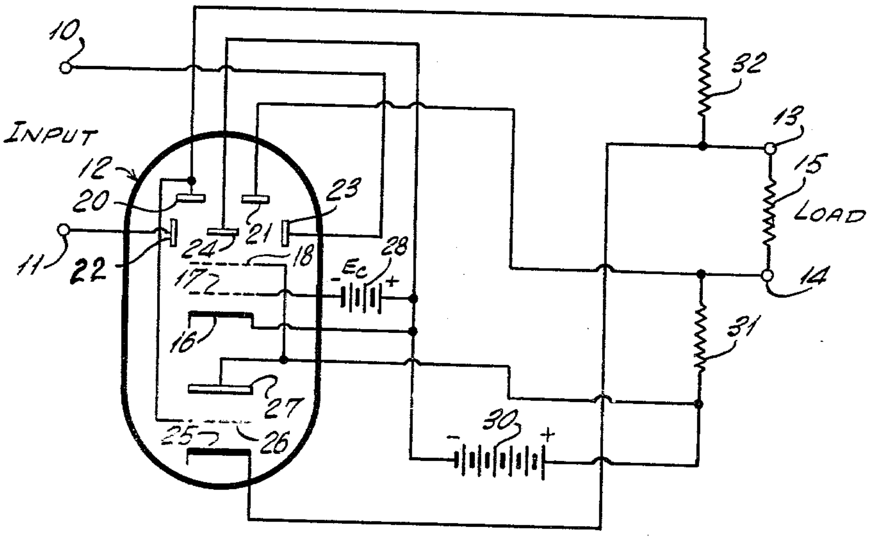
FIG. 1 is a schematic diagram of connections showing the direct current amplifier circuit.

Referring now to FIG. 1, the circuit includes two input terminals 10 and 11, a combination electron discharge device 12, output terminals 13 and 14 which are to be connected to a load 15, and other coupling circuits to be described later. The discharge device 12 includes two discharge components which may be enclosed in a single sealed envelope or they may be contained in separate envelopes. It is convenient to install both in the same envelope because in this manner several contact pins are eliminated. The deflection discharge device includes an electron emitting cathode 16, a control grid 17, an accelerator grid 18, two deflection anodes 20 and 21, two deflection electrodes 22 and 23, and a central shield 24. This discharge device may be constructed in a manner similar to the beam switching tube 6JH8 which is well-known in the art. The triode includes an electron emitting cathode 25, a control electrode 26, and an anode 27. Inside the envelope the anode 20 is connected to the triode control electrode 26 while the triode anode 27 is connected to the accelerator electrode 18.

External of the envelope, input terminals 10 and 11 are connected directly to deflection electrodes 22 and 23. A bias battery 28 or other suitable source of potential is connected between control electrode 17 and the negative terminal of a power supply 30. This terminal is also connected to cathode 16 and the shield 24. The positive terminal of supply 30 is connected to triode anode 27, accelerator electrode 18, and a resistor 31 whose other end is connected to output terminal 14 and anode 21. The triode cathode is connected directly to output terminal 13 and to resistor 32, the other end of which is connected directly to anode 20.

The operation of this circuit is as follows: When the circuit is first turned on with no potentials applied to the input terminals, the electron stream which is emitted from cathode 16 is directed to shield 24 and no current passes through either of anodes 20 or 21. At this time no current flows through the load. Now, let it be assumed that a positive potential is applied to input terminal 11 thereby making deflection electrode 22 positive so that a portion of the electron stream is deflected away from shield 24 and strikes anode 20. In this condition a load current flows through load 15 and the current path may be traced from the positive terminal of power supply 30, through resistor 31, load 15, resistor 32, anode 20, to cathode 16 and back to the power supply 30. Now, let it be assumed that a positive potential is applied to input terminal 10 thereby making deflection electrode 23 positive and deflecting the electron stream from shield 24 to anode 21. The current through the circuit and load may then be traced from the positive terminal of supply 30 through the triode by way of anode 27 and cathode 25 to output terminal 13, then through load 15 in the reverse direction to output terminal 14, anode 21, cathode 16, and back to the power supply 30.

During the first part of the above described operation, when terminal 11 is made positive, the triode cannot conduct because the current through resistor 32 lowers the potential of anode 20 and applies a potential to control electrode 26 which is lower than the cathode 25. In this condition no current flows through the triode. During the second portion of the operation described above, when terminal 10 was made positive, the triode is made conductive because no current now flows through resistor 32 and therefore the control electrode 26 and cathode 25 are at the same potential.

Figure 2:
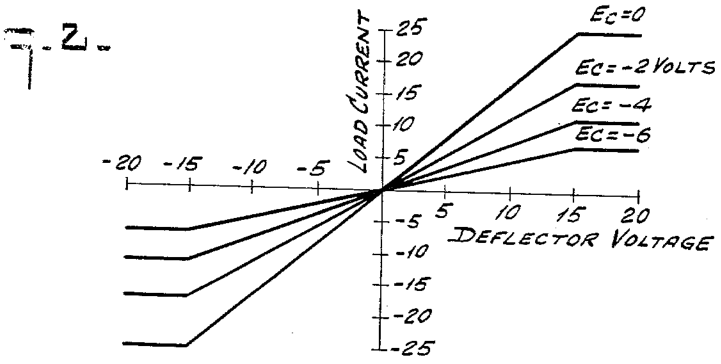
FIG. 2 is a graph showing the relationship between the load current and the deflector voltage for several values of the biasing potential applied to the control electrode of the deflection discharge device.
Figure 3:
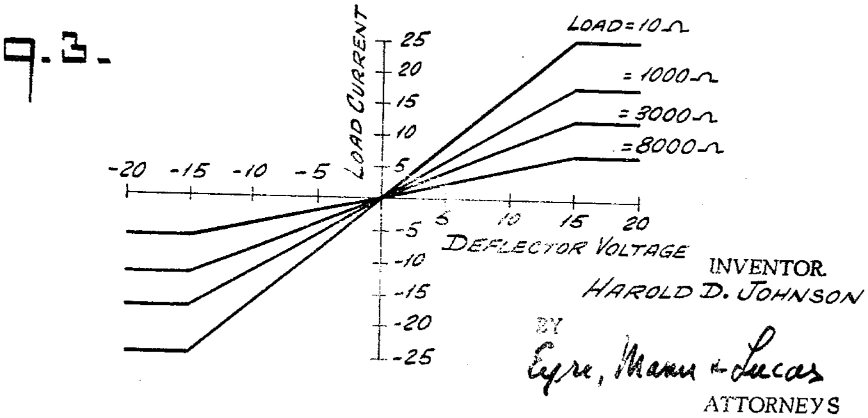
FIG. 3 is a graph similar to to FIG. 2 except that the characteristics are shown for several values of the load resistor.

The above described operation produces a series of linear characteristic curves which are shown in FIGS. 2 and 3. One reason why the device is safe and convenient to use is because it is not subject to overloading. An excess potential applied to either input terminal 10 or 11 merely moves the beam farther along the area of one of the anodes 20 or 21 and this action does not increase the current through the device and therefore the device does not overheat. The curves shown in FIGS. 2 and 3 were taken with two separate tubes, a beam switching tube 6JH8 and a pentode 12EK6 with the second grid connected to the anode thereby making its operation similar to a triode. For these curves resistor 32 was 100 ohms and resistor 31 was 2200 ohms with an applied potential 30 of 310 volts.

The foregoing disclosure and drawings are merely illustrative of the principles of this invention and are not to be interpreted in a limiting sense. The only limitations are to be determined from the scope of the appended claims.

I claim:

1. A direct current amplifier comprising:
(a) a pair of input terminals for connection to a signal source;
(b) a deflection discharge device which includes an evacuated envelope, a cathode with means for emitting a stream of electrons, a first and second anode mounted adjacent to each other, and two deflection electrodes adapted to shift said electron stream from one anode to another, said deflection electrodes respectively positioned adjacent to said anodes;
(c) connecting means sealed through the envelope for connecting the input terminals to the deflection electrodes;
(d) a direct current power supply with connecting means sealed through the envelope for connecting the negative terminal of the power supply to the cathode;
(e) a load circuit including a pair of output terminals connected to a load;

(f) a first resistor connected between one of the load terminals and the first anode;
(g) a second resistor connected between the other load terminal and the positive terminal of said power supply;
(h) connecting means between the second anode and the junction of the load and the second resistor;
(i) and a triode electron discharge device positioned within said envelope and including a third anode connected to the positive terminal of the power supply, a second cathode connected to the junction of the load and the first resistor, and a control electrode connected to the junction of the first resistor and the first anode.

2. A direct current amplifier as claimed in claim 1 wherein a neutral electrode is positioned between said anodes within the envelope, said neutral electrode being connected to said first mentioned cathode and adapted to receive the electron stream therefrom when no signal voltage is applied to the input terminals.

3. A direct current amplifier as claimed in claim 1 wherein said deflection discharge device includes a control electrode mounted adjacent to the first mentioned cathode and connected in series with a bias source of potential and the cathode.

4. A direct current amplifier as claimed in claim 1 wherein said deflection discharge device is enclosed in a first sealed envelope and said triode is enclosed in a second sealed envelope.

No references cited.

ROY LAKE, *Primary Examiner.*

NATHAN KAUFMAN, *Examiner.*